(12) United States Patent
Arutinov et al.

(10) Patent No.: US 11,825,610 B2
(45) Date of Patent: Nov. 21, 2023

(54) PROCESS FOR THE MANUFACTURING OF PRINTED CONDUCTIVE TRACKS ON AN OBJECT AND 3D PRINTED ELECTRONICS

(71) Applicant: Nederlandse Organisatie voor toegepast-natuurwetenschappelijk onderzoek TNO, 's-Gravenhage (NL)

(72) Inventors: Gari Arutinov, Helmond (NL); Merijn Peter Giesbers, Veldhoven (NL)

(73) Assignee: Nederlandse Organisatie voor toegepast-natuurwetenschappelijk onderzoek TNO, 's-Gravenhage (NL)

(*) Notice: Subject to any disclaimer, the term of this patent is extended or adjusted under 35 U.S.C. 154(b) by 0 days.

(21) Appl. No.: 17/273,114

(22) PCT Filed: Sep. 13, 2019

(86) PCT No.: PCT/NL2019/050596
§ 371 (c)(1),
(2) Date: Mar. 3, 2021

(87) PCT Pub. No.: WO2020/055253
PCT Pub. Date: Mar. 19, 2020

(65) Prior Publication Data
US 2021/0227697 A1     Jul. 22, 2021

(30) Foreign Application Priority Data

Sep. 14, 2018   (EP) .................................... 18194389

(51) Int. Cl.
*H05K 3/12*       (2006.01)
*H05K 3/00*       (2006.01)
(Continued)

(52) U.S. Cl.
CPC ............ *H05K 3/1258* (2013.01); *B33Y 80/00* (2014.12); *H05K 3/0032* (2013.01); *H05K 3/28* (2013.01);
(Continued)

(58) Field of Classification Search
CPC .. B23K 26/364; H05K 3/0032; H05K 3/1258; B33Y 10/00
See application file for complete search history.

(56) References Cited

U.S. PATENT DOCUMENTS 4,497,692 A * 2/1985 Gelchinski ............. C25D 5/026
204/224 R
5,358,604 A * 10/1994 Lin ....................... B29C 43/003
427/98.8

(Continued)

FOREIGN PATENT DOCUMENTS

CN       104244579 A      12/2014
CN       104797087 A       7/2015
(Continued)

OTHER PUBLICATIONS

European Patent Office, International Search Report in corresponding International Application No. PCT/NL2019/050596, dated Dec. 20, 2019 (3 pages).

(Continued)

*Primary Examiner* — Michael P Wieczorek
(74) *Attorney, Agent, or Firm* — Leydig, Voit & Mayer, Ltd.

(57) ABSTRACT

The present disclosure concerns methods for the manufacturing of products with printed conductive tracks. The process comprising scribing a first trench into the surface of the object, wherein on a border of the trench a first ridge is formed to define a first edge of a material receiving track. At a distance from the first trench a second trench is formed, (Continued)

wherein on the borders of the second trench a second ridge is formed facing the first ridge. The first and second ridges define a material receiving track which may be provided with a material suited to form a conductive track.

11 Claims, 4 Drawing Sheets

(51) Int. Cl.
    *H05K 3/28*     (2006.01)
    *B33Y 10/00*     (2015.01)
    *B33Y 80/00*     (2015.01)

(52) U.S. Cl.
    CPC ........ *B33Y 10/00* (2014.12); *H05K 2203/107* (2013.01)

(56) References Cited

U.S. PATENT DOCUMENTS

| | | |
|---|---|---|
| 2003/0201258 A1 | 10/2003 | DeSteur et al. |
| 2008/0001297 A1* | 1/2008 | Lotz ........................ H05K 3/465 257/774 |
| 2008/0110869 A1* | 5/2008 | Chen .................... B23K 26/364 219/121.75 |
| 2012/0184099 A1 | 7/2012 | Souter |
| 2015/0068787 A1 | 3/2015 | Chung et al. |
| 2016/0067780 A1* | 3/2016 | Zediker .............. B23K 26/0876 219/76.12 |

FOREIGN PATENT DOCUMENTS

| | | | |
|---|---|---|---|
| CN | 107921582 A1 | | 4/2018 |
| JP | 2002/232119 A | | 8/2002 |
| JP | 2002/290010 A | | 10/2002 |
| WO | WO 2009/050938 A1 | | 4/2009 |
| WO | WO 2012/121141 A1 | | 9/2012 |
| WO | WO 2014/139795 A1 | | 9/2014 |

OTHER PUBLICATIONS

Raffaella Suriano, "Femtosecond laser ablation of polymeric substrates for the fabrication of microfluidic channels," Elsevier—Applied Surface Science, vol. 257, No. 14, pp. 6243-6250 (2011), XP028368544.

Ji-Yen Cheng, "Direct-write laser micromachining and universal surface modification of PMMA for device development," Elsevier—Sensors and Actuators B Chemical, vol. 99, No. 1, pp. 186-196 (2004) XP055564872.

Japanese Patent Office, Notice of Reasons for Rejection in corresponding Japanese Patent Application No. 2021-514020 dated May 22, 2023.

* cited by examiner

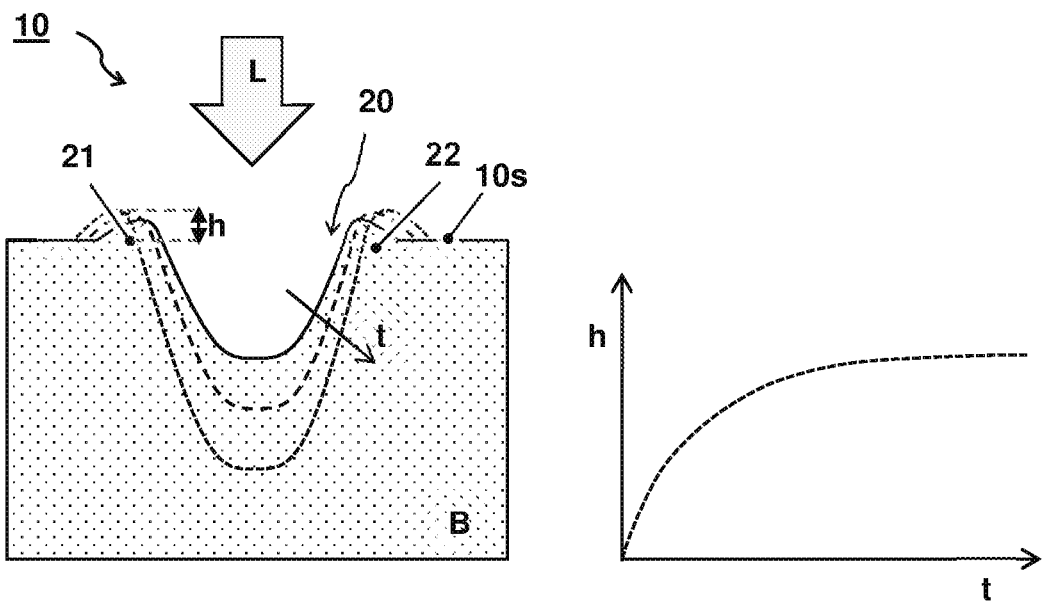
FIG 2A
FIG 2B
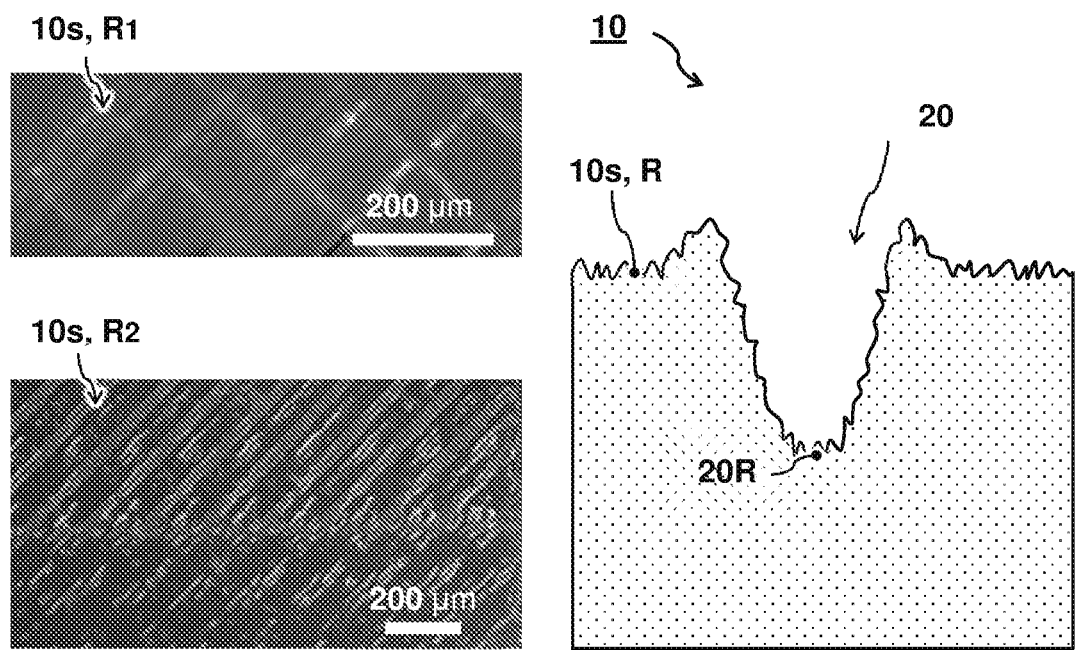
FIG 2C

PROCESS FOR THE MANUFACTURING OF PRINTED CONDUCTIVE TRACKS ON AN OBJECT AND 3D PRINTED ELECTRONICS

CROSS-REFERENCE TO RELATED APPLICATIONS

This patent application is a U.S. National Phase of PCT International Application No. PCT/NL2019/050596, filed Sep. 13, 2019, which claims priority to European Application No. 18194389.5 filed Sep. 14, 2018, which are both expressly incorporated by reference in their entireties, including any references contained therein.

TECHNICAL FIELD AND BACKGROUND

The present disclosure relates to methods for the manufacturing of products with printed conductive tracks.

Additive manufacturing methods typically use a fixed reference frame which is connects a material deposition element and a target substrate for building the object. Using additive manufacturing methods 3D objects are generally made in a layer-by-layer building fashion. Individual layers may be formed by moving the deposition element relative to the target substrate in a raster scanning like pattern, or vice versa. In this way various positions of the substrate are sequentially addressed. By depositing an amount of construction material at a number of these various locations a layer of an 3D object may be formed. Examples of such methods include 3D printing methods as, drop-on-demand printing processes, fused deposition modelling, and laser-induced forward transfer methods. Alternatively, layers may be build by methods wherein parts of a continuous layer of precursor material are locally fixed, e.g. cross-linked, for example by a scanning fixation element, e.g. a laser. Examples of such methods include selective laser sintering and stereo lithography (SLA). Irrespective of the chosen method, the raster scanning pattern used during layer construction typically leads to the formation of 3D products with a rough surface finish, or even surfaces wherein the fast and slow axis of the scanning patterns are visible. Manufacturing of 3D objects comprising electronic elements requires the formation of conductive elements, e.g. conductive tracks, pads and/or other elements. Preferably, these conductive elements, may as well be deposited by additive manufacturing methods. However, due to the poor surface finish providing narrow tracks, or even continuous tracks without defects, e.g. tracks without gaps or regions with poor conduction along the length of the tracks is challenging. For example, material to form a conductive track that is deposited in a liquid state, in a series of locations to form a line, e.g. by adjacent or partially overlapping locations, may flow uncontrollably along the rough surface it is deposited on. This may lead to the formation of a line with irregular edge definition or even to the formation of non-continuous lines. This severely limits the application of 3D printed electronics, since the surface finish is critical to accuracy of deposited conductive track and accordingly critical to the performance of the part. Forming a trench or groove, e.g. by local laser ablation, and forming the conductive line inside this trench may appear to provide a solution. While providing a trench or groove may prevent a liquid material from flowing outside the groove, the rough surface finish inside the trench may still lead to formation of conductive tracks with poor edge definition and/or discontinuous tracks.

The present disclosure aims to provide a solution for the above problems by providing a method to dispose material receiving tracks onto a surface of 3D objects, wherein the tracks are configured to allow formation of continues conductive tracks. Advantageously, the presented method may be applied without removing the 3D object from the reference frame.

SUMMARY

Aspects of the present disclosure relate to a process for the manufacturing of printed conductive tracks on a object. In the process a first surface s of an object comprising a base material B is irradiated with a light L along a first trajectory T1. By irradiating the object, a volume of the object under the light may be locally heated. By heating the object along a trajectory, a first trench may be scribed into the first surface s of the object. Preferably on a border, e.g. edge of the trench a first ridge is formed. This ridges may define a first edge of a material receiving track. By scribing a second trench along a second trajectory T2 a second trench may be formed. Preferably, the second trench is formed at least in part adjacent to the first trench. Preferably, a second ridge may be formed on the borders of the second trench facing the first ridge. Between two adjacent ridges a material receiving track may be defined. In other words, the material receiving track may be defined between ridges of two adjacent trenches that are scribed at a distance, from each other into the surface of the object. After providing the material receiving track, said track is provided with a material M suited to form a conductive track on the surface of said object.

The object may be an item obtainable by additive manufacturing process, e.g. a modelled item, e.g. formed by printing methods. Advantageously the method to form the object and the method to scribe the lines may be performed on a tool such that the methods share a common reference frame. By performing the methods on a tool such that the methods share a common reference frame, the manufacturing of the material receiving track may be performed without a need for an alignment step. For example, additive manufacturing and scribing of the trenches may be performed on a single tool without a presence of a need to remove the object from a first building tool and placing, and accordingly aligning the object to a scribing tool. Alternatively, or in addition the tool for providing the material receiving track and the tool for providing the track with a material M suited to form a conductive track may share a common reference frame.

As will become clear from the description, the embodiment and figures below the described method may be used for the manufacturing of 3D printed electronics. Advantageously, 3D printed electronics may be manufactured with a surface comprising conductive tracks with a width below 50 µm. Alternatively or in addition, such conductive tracks may be, at least in part, embedded into the object. Aspects of the present disclosure also relate to such products.

BRIEF DESCRIPTION OF DRAWINGS

These and other features, aspects, and advantages of the process, methods, and formed products of the present disclosure will become better understood from the following description, appended claims, and accompanying drawings wherein:

FIGS. 2A and B schematically illustrate the evolution of trench depth and ridge height with increasing scribing time;

FIG. 2C schematically illustrates a side view of a trench scribed in an object with a rough surface along with two micrographs of top surface areas of objects made by additive manufacturing processes;

DESCRIPTION OF EMBODIMENTS

Figure 1A:
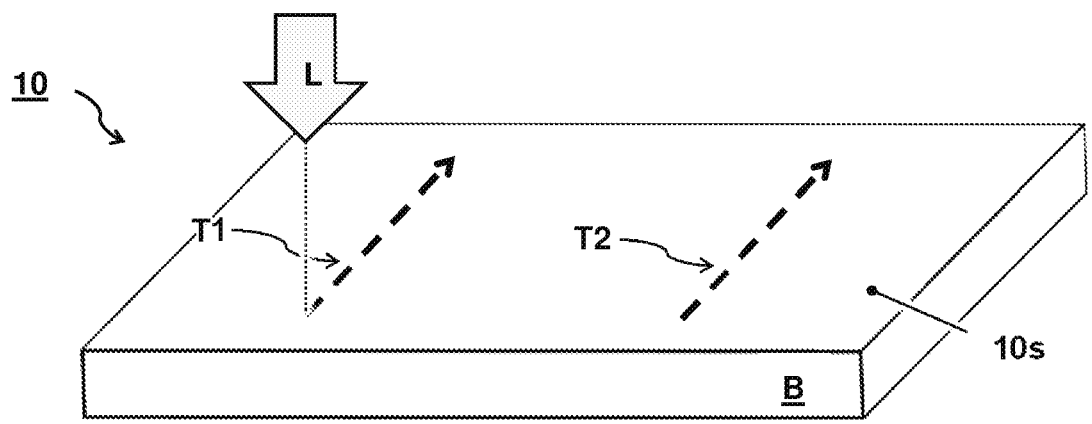
FIG. 1A-C schematically illustrate the formation of a trench as well as perspective and side view of a material receiving track defined between two ridges of adjacent trenches.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

As used herein, conductivity and the conductivity of formed conductive tracks relates to conductivity levels common in the field of printed electronics. For example, conductive tracks may be formed by deposition of a precursor materials comprising conductive micro- or nano particles. Conductivity of tracks formed from materials comprising such conductive particles may be in a range between 5% and 25% of that of the bulk material.

The invention is described more fully hereinafter with reference to the accompanying drawings, in which embodiments of the invention are shown. In the drawings, the absolute and relative sizes of systems, components, layers, and regions, in particular the size of ridges and trenches may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIGS. 1A and B schematically illustrate a process for the manufacturing of a material receiving track 40 on a object 10. In one embodiment, e.g. as shown in FIG. 1A, the process may comprise irradiating with a light L a first surface 10s of an object 10 comprising a base material B. By locally irradiating the object 10 a volume of the object under the light L may be heated. By irradiation the object 10 along a first trajectory T1 a first trench 20 may be formed, e.g. scribed, into the first surface 10s of the object 10. In a preferred embodiment, a first ridge 21 is formed on a border, e.g. edge of the trench. In another or further preferred embodiment the first ridge 21 may define a first edge of a material receiving track 40. In one embodiment, e.g. as shown, a second trench 30 may be formed along a second trajectory T2 wherein the second trench 30 is formed at least in part adjacent to the first trench 20, wherein on the borders of the second trench a second ridge 31 is formed facing the first ridge 21, to define a second edge of the material receiving track 40. In some preferred embodiments, the process may further comprise providing the material receiving track 40 with a material M suited to form a conductive track 50 (as shown and discussed later, e.g. in FIG. 3).

Figure 1B:
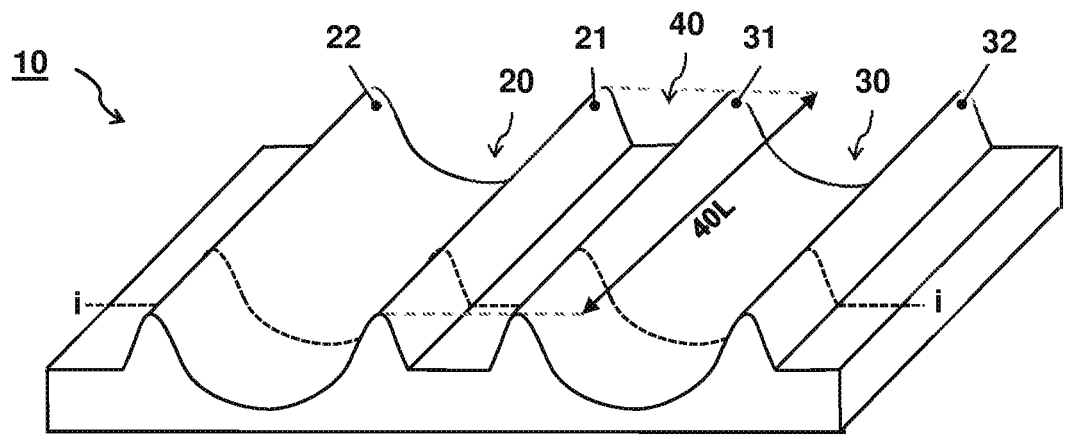
Figure 1C:
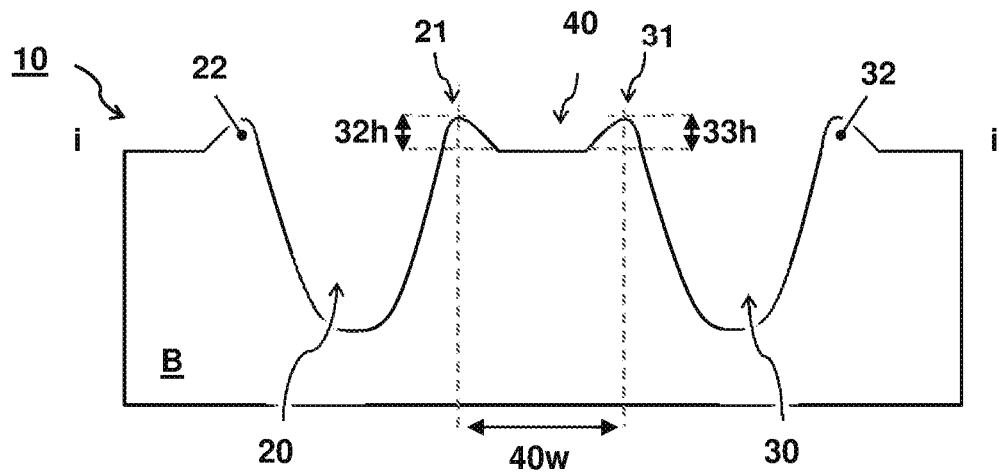

In another or further embodiment, e.g. as shown in FIG. 1B and corresponding side view in FIG. 1C a material receiving track 40 may be provided on the surface of an object 10. By providing two trenches 20,30 each comprising protruding ridges 21,22 respectively 31, 32 along its edge a material receiving track 40 may be defined. On the sides this material receiving track 40 may be defined by facing ridges 21 and 31 of adjacent trenches 20 and 30. Between these ridges, e.g. the bottom surface of the material receiving track 40 an unmodified part of the first surface 10s may be present. The length of the material receiving track 40L may be defined by the length over which first and second trenches follow adjacent trajectories. The width of the material receiving track may be controlled by the distance between two adjacent tracks. For example, the dimension of the material receiving track 40 may be defined by the peak-to-peak distance between facing ridges. By scribing trenches along pre-defined trajectories one or more of the length and shape, e.g. curvature, corners, and width of the material receiving track may be controlled.

Without being bound to theory it is believed that applying an amount of energy by light L to a area of object 10 may result in one or more of a melting, evaporation, and partial decomposition of the base material B in a volume below this area. By administering an increasing dose of energy an increasing amount of material may be evaporated and increasingly deep holes and or trenches may be formed. In combination with evaporating base material B, part of the evaporated material may be redeposited along the boundaries or irradiated area whereby, depending on dose, a protruding ridge may be formed. Dose may be controlled, for example, by the scanning speed, e.g. residence time of the light L. Alternatively, or in addition, the scribing process may be controlled by light intensity and/or pulse duration or a combination thereof. It will be appreciated that besides energy dose, trench formation and/or ridge formation may be influenced by the nature of base material B, e.g. materials with a higher melting, evaporation, and/or decomposition temperature, may require a different energy dose.

In some preferred embodiments, the light L may comprise a laser light. Preferably, a laser light with adjustable intensity or pulse duration to allow additional control over the energy dose applied to the object 10. Alternatively, other energy sources, such as plasma beams may be used.

It was experimentally found that for a given base material B the depth and/or width of trenches scribed with light L increases with increasing dose, e.g. as shown in FIG. 2A. In other words, it is believed that the more energy that is applied to the object, the more of the material B may be removed, e.g. vaporized, the deeper and/or wider the trench becomes. In contrast, the height of the ridges at the borders of the trench tends to level off after an initial growth stage, e.g. as shown in FIGS. 2A and B. Advantageously, a material receiving track may be formed with ridges that may have a substantially constant height along the length of the trench.

In some preferred embodiments, the object may be an item formed from a material comprising a polymer. Polymers may be preferred because polymers may be particularly suitable for scribing trenches by light L.

In another or further preferred embodiment, the object may be an item obtainable by additive manufacturing process, e.g. 3D modelled objects. Currently, there are a large number of technologies that employ additive manufacturing principles, including but not limited to stereolithographic (SLA), fused deposition modeling (FDM), selective laser sintering (SLS), selective laser melting (SLM), 3D printing (3DP) and laser-induced forward transfer (LIFT). Advantageously, additive manufacturing process may use a broad range of materials, e.g. polymers (photo- and thermoplastics), ceramics, metals for the manufacturing of objects, e.g. 3D models. Irrespective of the chosen manufacturing process, the raster scanning pattern that is typically used during these processes may lead to the formation of 3D products with a poor surface finish, e.g. rough surfaces. In some items, the fast and slow axis of the scanning patterns may be visible in formed products. FIG. 2c (left) depicts micrographs of the top surface 10s illustrating the surface finish, of an object made by forward transfer modeling LIFT having a roughness R1, and made by stereo lithography, having a roughness R2. Alternatively, objects may be formed by other additive manufacturing methods. Preferably, an object comprises a polymer. Polymers may be especially suited for forming 3D modeled items, e.g. by additive manufacturing methods.

In some embodiments, e.g. as illustrated in FIG. 2C (right), a trench 20 may be scribed into an object with a rough surface 10s with a roughness R. Similar to trenches illustrated before, e.g. in FIGS. 1 and 2A a ridge may be formed. By providing a ridge on a rough surface the formed ridge may, al least in part, follow the roughness of the substrate. FIG. 2C (right) schematically illustrates that the surface of scribed trenches, e.g. trenches scribed by laser scribing may also have a surface roughness. Without being bound be theory, roughness 20R of the trench surface may be a result from a combination of evaporating base material B and redisposition of part of the evaporated material along the trench surface in a process that may be similar to the formation of ridges. Preferably, formed ridges are higher than the roughness of the surface they are formed on. By providing a ridge with a height exceeding that of the roughness of the substrate, material M to form the conductive track, may be prevented from flowing over the ridge. Preferably, the ridge has a height larger than 5 times the roughness. More preferably, the ridge has a height in excess of 10 times the roughness. Roughness may be defined as a root-mean-square roughness Rq. Roughness may include naturally occurring surface roughness but may also include process related roughness, e.g. roughness formed during manufacturing of the 3D modelled item, e.g. resulting from a scanning motion of the deposition nozzle. Roughness may be described by common parameters such as room-mean-square roughness and may be determined accordingly by well-know surface characterization methods such as the ISO 4287:1997 standard on geometrical product specifications (GPS).

Figure 3A:
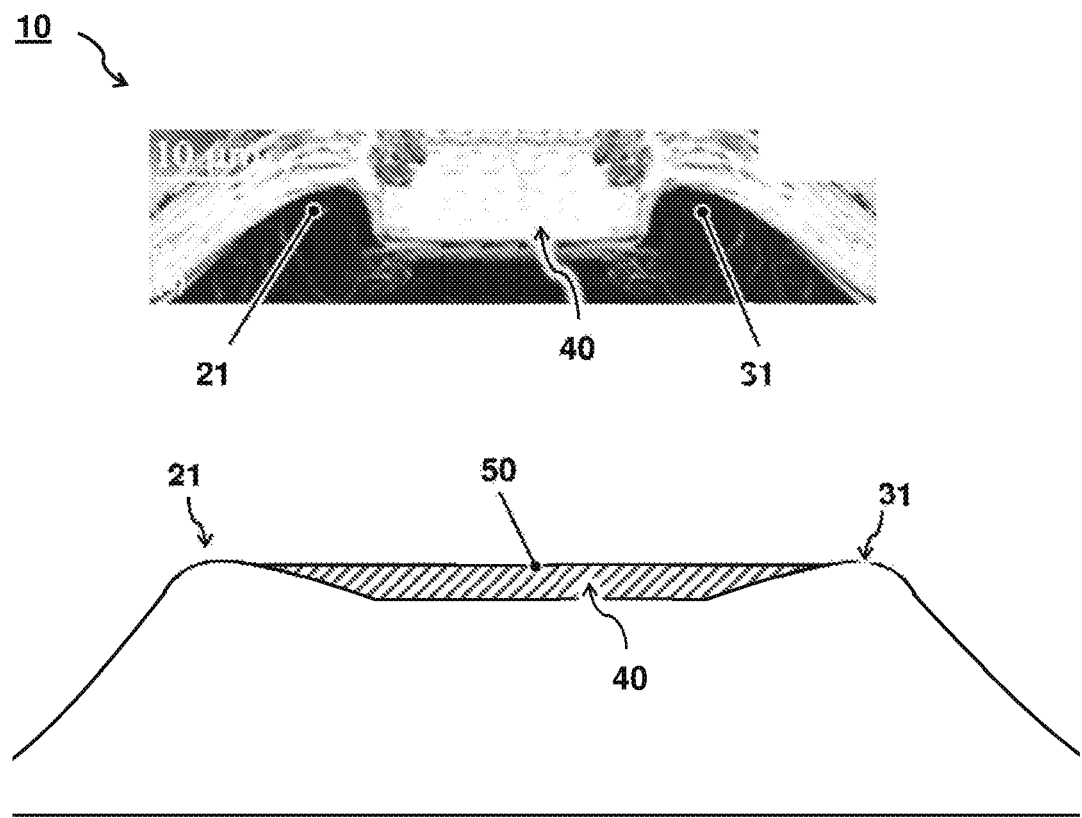
FIG. 3A schematically illustrates a side view of a conductive track formed in a material receiving track along with a side-view micrograph of an material receiving track.

FIG. 3A (top) depicts a cross section view of an object with a material receiving track 40 that is defined by a first ridge 21 and second ridge 31 of scribed first and second first trenches 20, 30, not shown. FIG. 3A (bottom) schematically depicts a cross section view of a conductive track 50 deposited in a material receiving track 40. In another or further preferred embodiment a deposition method e.g. ink jet deposition and/or laser-induced forward transfer (LIFT), may be used for providing the material receiving track 40 with a material M suited to form a conductive track. For example, material may be deposited from a tool comprising an orifice, e.g. nozzle, onto a first location on the receiving surface, forming a dot of material thereon. By moving one or more of the receiving surface and the deposition tool a continuous shape, e.g. constructed from partially overlapping dots, may be formed, e.g. a line or filled in area, e.g. pads. Alternatively, material M suited to form a conductive track, may be deposited in the material receiving track 40 using a continuous deposition process. Preferably, one or more, preferably all, of the methods to form the 3D modelled object, to define the material receiving track 40, and to deposit the material M suited to form a conductive track, share a common reference frame. By sharing a common reference frame the manufacture of products with printed conductive tracks may be performed in a single tool. An advantage may be a higher accuracy of track location with respect to other features on the object. In other or further preferred embodiments a device suited for the LIFT method is used for one or more, preferably all, of the steps to form the 3D object, to scribe the trenches 20,21, and to provide the material M to form the conductive track 50. Alternatively, the common reference frame may be provided by providing a reference frame with a separate tools, e.g. a tool for deposition of material M, e.g. a drop-on-demand inkjet printhead.

In other or further embodiments, material M suited to form a conductive track may be provided in a dielectric form or in other words, material M may be provided to the track as an insulator. This material, provided in a non-conductive form, may be rendered conductive in a subsequent process step. For example, the deposition conditions may dictate the form and/or formulation of material M, e.g. inkjet deposition may require a composition with a low viscosity comprising, for example an ink comprising nanoparticles. Such composition may be converted to a conductive track, for example in a subsequent process step, e.g. comprising heating and/or reduction.

Figure 3B:
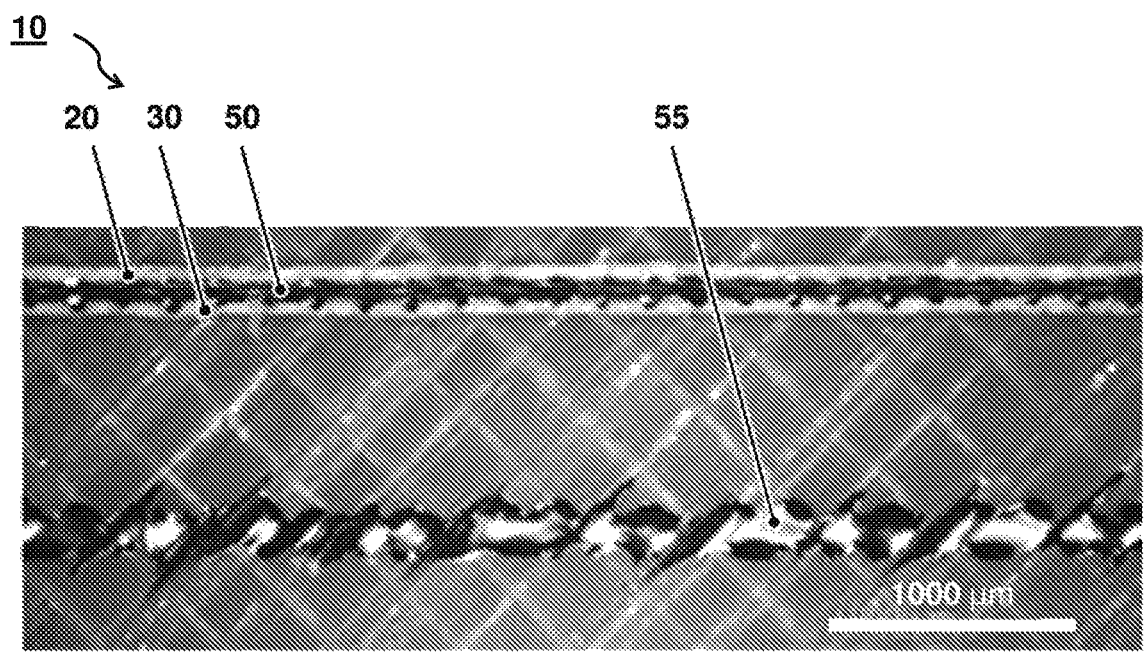
FIG. 3B depicts a top view micrograph comparing exemplary conductive tracks formed with (top) and without (bottom) using a material receiving track.

FIG. 3B depicts a top-view image of conductive track formed on a surface of a 3D manufactured polymer object 10. The exemplary conductive track 50 was manufactured by laser-induced forward transfer of a material M using a material receiving track 40 defined between ridges of first and second scribed trenches 20,30. The lower conductive track 55 was manufactured without defining a material receiving track. As can be observed in FIG. 3B the exemplary conductive track 50 formed on a material receiving track forms a continuous line, e.g. without gaps over the length of the material receiving track. In contrast, material M deposited directly on the polymer surface is affected by the surface roughness. Visible, for example, is a result flow of material M over the surface along roughness, resulting in widening of widening of track 55 at certain points along the length of the track. Also visible, is the formation of constrictions, e.g. necks, at other locations along the length of the track, which may lead to the formation of defects, e.g. gaps.

In another or further preferred embodiment the method for the manufacturing of products with printed conductive comprises heating the surface of the object 10 to reduce the surface roughness at least at the location where the material receiving track will be defined. By heating the surface of an object, e.g. a polymer object, above a softening temperature, e.g. a glass transition temperature or a melting temperature, the roughness of that surface may be reduced. By heating the surface of a 3D object at locations where in subsequent steps a material receiving track will be defined, the surface of formed material receiving track 40 between the first and second ridges may be provided with less roughness, e.g. a smoother finish. One effect of providing a material receiving track 40 with a smooth finish may be that the number of defects in the conductive track 50 may be reduced, e.g. less roughness is present which may interfere with the wetting or flow of material M to form a conductive track during the deposition process. An additional effect of providing a smoother surface may be that first and/or second ridges formed during the scribing process may have a smoother surface, e.g. profile, along the top of said ridges. By providing a smooth ridge, the number of defects in the conductive track 50 may be reduced e.g. defects formed during the deposition process of the material M to form the conductive track 50, e.g. spilling over, or flowing between, gaps. In some preferred embodiments the heating may comprise locally irradiating the object 10 with a laser light along a pre-defined trajectory. Preferably, irradiation is provided at locations corresponding to the location of the material receiving track 40, to locally bring the part of the object under the laser light above a softening temperature to smoothen the surface of the object before scribing a trench. In addition, the heating may comprise a global heating step, e.g. heating the whole object, for example in an oven. Alternatively, reducing the roughness may be achieved by a polishing or any other suitable surface treatment step. Advantageously the same laser light source may be used during one or more, preferably all, of: forming the object, reducing the roughness, defining the material receiving track 40, and depositing the material M suited to form a conductive track. By sharing a single reference frame a higher accuracy of track location with respect to other features on the object may be obtained since multiple steps may be performed on the same manufacturing tool and additional positioning or alignment steps may be omitted.

In some preferred embodiments an additive process step for the deposition of base material B may follow after depositing the material M to form a conductive track, e.g. further building the 3D object. In other words, after filling the material receiving track additional layers of a material, e.g. base material B, may be added onto the 3D item. Preferably, the additional layers, e.g. of base material B, at least in part cover the conductive track. By depositing one or more additional layers of base material B a 3D product may be formed with integrated electronics wherein conductive tracks are, at least in part, embedded in the 3D product, for example for shielding the electronics, e.g. from touch.

Figure 4A:
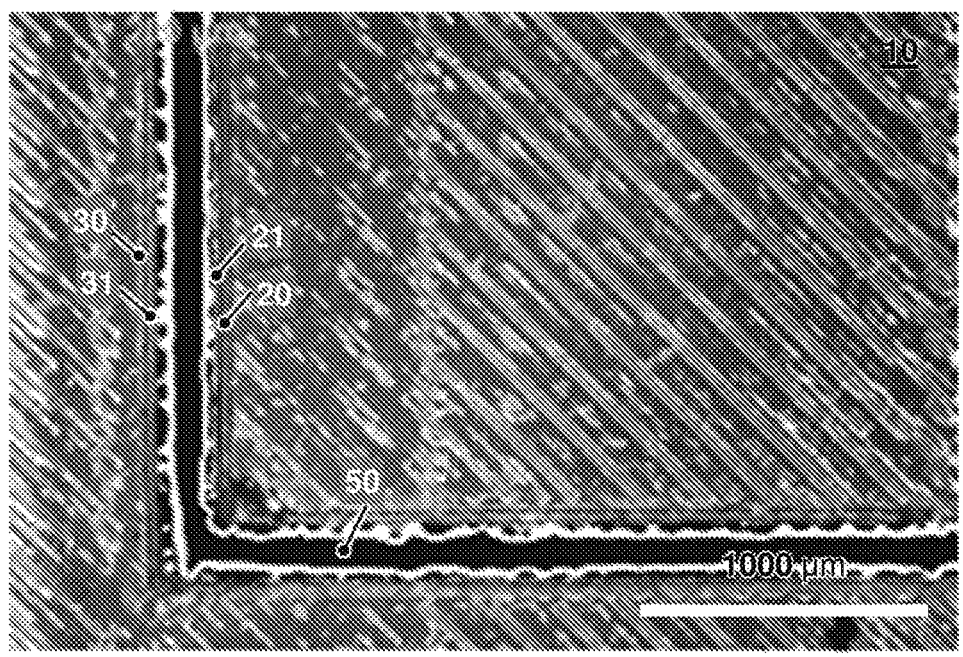
FIG. 4A depicts a top view micrograph illustrating a conductive track formed using a material receiving track.
Figure 4B:
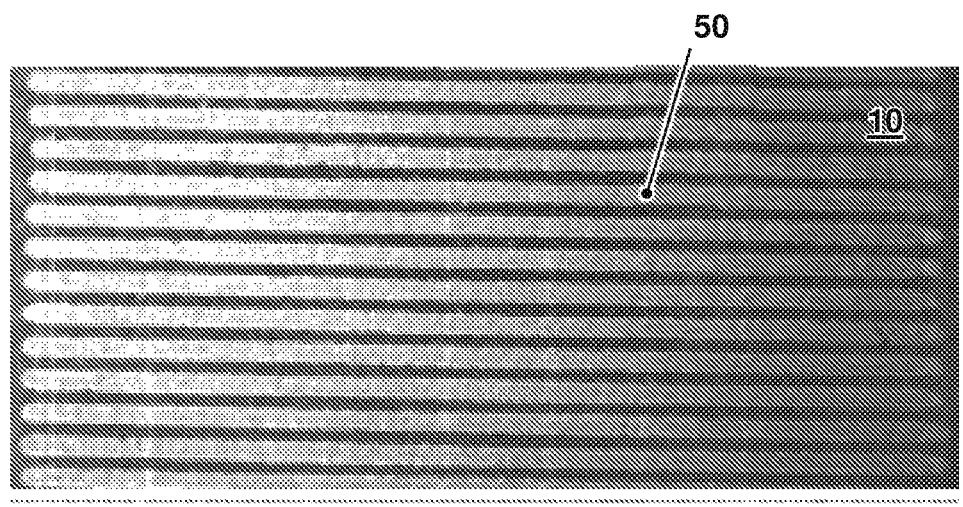
FIG. 4B depicts a micrograph of a top surface of a 3D printed object comprising a dense array of conductive tracks formed using a material receiving track.

FIG. 4A displays a top-view image of an exemplary polymer object 10 made by an SLA method, comprising a cornered conductive track 50 that is confined between ridges 21 and 31 of trenches 20 and 30. In one embodiment, e.g. as shown in FIGS. 4A and B, material M to form the conductive track 50 has been provided by LIFT. FIG. 4B displays a top-view image of an exemplary polymer object 10 made by an SLA method, comprising an array of conductive tracks 50, provided onto a corresponding array of material receiving tracks that are each confined between ridges of adjacent trenches (not marked). For example, the edges of a first material receiving track may be defined by ridges of adjacent first and second trenches (not marked). By providing an additional trench at a distance of the second trench, e.g. a third trench, a second material receiving track may be defined. Preferably, the second material receiving track may be defined between the second ridge of the second trench and a first ridge of the third trench. By defining the second material receiving track between a ridge of trench that is already used to define a first material receiving track and a ridge of a new trench, e.g. third trench, the distance between adjacent material receiving tracks may be reduced. For example, 3D printed electronics may be obtained in which adjacent conductive tracks are spaced by a distance less than 200 µm, preferably less than 100 µm, more preferably less than 75 µm, most preferably less than 50 µm. Alternatively, the second material receiving track may be defined by providing a new pair of trenches, e.g. a third and fourth trench, at a distance from one another. Additional material receiving tracks may be defined to form an array.

For the purpose of clarity and a concise description, features are described herein as part of the same or separate embodiments, however, it will be appreciated that the scope of the invention may include embodiments having combinations of all or some of the features described. For example, while embodiments were shown for formation of ridges by scribing lines also alternative ways may be envisaged by those skilled in the art having the benefit of the present disclosure for achieving a similar function and result. Steps, e.g. deposition and heating, may be combined or split up into one or more alternative steps. The various elements of the embodiments as discussed and shown offer certain advantages, such as allowing the formation of continuous lines and allowing the embedding of formed conductive tracks into 3D objects. Of course, it is to be appreciated that any one of the above embodiments or processes may be combined with one or more other embodiments or processes to provide even further improvements in finding and matching designs and advantages. It is appreciated that this disclosure offers particular advantages for the manufacturing of 3D polymer products with printed conductive tracks on the surface, and in general can be applied for any application wherein conductive tracks are integrated in 3D products.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A process for manufacturing printed conductive tracks on an object comprising a base material, the process comprising:

scribing a first trench into a first surface of the object by irradiating the first surface of the object with a light along a first trajectory to locally heat a volume of the object under the light, wherein a first ridge is formed on a border of the first trench, and wherein the first ridge defines a first edge of a material receiving track;

scribing a second trench into the first surface of the object by irradiating the first surface of the object along a second trajectory or along a separate portion of the first trajectory, wherein the second trench is formed at least in part adjacent to the first trench, wherein a second ridge is formed on a border of the second trench, and wherein the second ridge faces the first ridge, to define a second edge of the material receiving track; and forming a conductive track between the first ridge and the second ridge by providing the material receiving track with a conductive material or a precursor to a conductive material.

2. The process according to claim 1, wherein:

the object is an object obtainable by additive manufacturing; and the first ridge and the second ridge, to define the first and second edges of the material receiving track, have a height in excess of at least 5 times a roughness of the first surface.

3. The process according to claim 1, wherein the object is a polymer object obtainable by additive manufacturing.

4. The process according to claim 1, wherein a deposition method is used for providing the material receiving track with the conductive material or precursor to a precursor material.

5. The process according to claim 1, wherein a tool additive manufacturing to form the object and a tool for scribing the first trench and the second trench share a common reference frame.

6. The process according to claim 1, wherein a tool for scribing the first trench and the second trench and a tool for providing the material receiving track with conductive material or precursor to a conductive material share a common reference frame.

7. The process according to claim 6, wherein the scribing the first trench and the second trench and the providing the material receiving track with the conductive material or a precursor to a conductive material are carried out using a laser.

8. The process according to claim 1, further comprising heating the first surface of the object to reduce a roughness of the first surface at least at a location where the material receiving track is subsequently formed.

9. The process according to claim 1, wherein after depositing the conductive material or a precursor to a conductive material to form a conductive track, a further additive process step follows for covering at least a part of the conductive track.

10. The process according to claim 1, wherein the process is used to manufacture a 3D printed electronic object.

11. The process according to claim 1, further comprising a step of rendering the precursor to the conductive material conductive.

* * * * *